United States Patent
Chang et al.

(10) Patent No.: US 11,182,277 B1
(45) Date of Patent: Nov. 23, 2021

(54) HIGH-SPEED RADIATED SPURIOUS EMISSION AUTOMATED TEST SYSTEM AND METHOD THEREOF

(71) Applicant: SPORTON INTERNATIONAL INC., New Taipei (TW)

(72) Inventors: Hsuan-Chi Chang, Taoyuan (TW); Chin-Hong Yao, Taoyuan (TW)

(73) Assignee: SPORTON INTERNATIONAL INC., New Taipei (TW)

( * ) Notice: Subject to any disclaimer, the term of this patent is extended or adjusted under 35 U.S.C. 154(b) by 0 days.

(21) Appl. No.: 17/080,776

(22) Filed: Oct. 26, 2020

(30) Foreign Application Priority Data

Sep. 3, 2020 (TW) ................. 109130133

(51) Int. Cl.
*G06F 11/36* (2006.01)

(52) U.S. Cl.
CPC ........ *G06F 11/3684* (2013.01); *G06F 11/368* (2013.01); *G06F 11/3692* (2013.01)

(58) Field of Classification Search
CPC . G06F 11/368; G06F 11/3684; G06F 11/3692
See application file for complete search history.

(56) References Cited

PUBLICATIONS

B. Audone and R. Colombo, "Measurement of radiated spurious emissions with the substitution and field strength test methods," 2016 International Symposium on Electromagnetic Compatibility—EMC Europe, 2016, pp. 353-357, doi: 10.1109/EMCEurope.2016.7739197. (Year: 2016).*

* cited by examiner

*Primary Examiner* — Hanh Thi-Minh Bui
(74) *Attorney, Agent, or Firm* — Chun-Ming Shih; HDLS IPR Services

(57) ABSTRACT

A high-speed RSE automated test system includes a RSE test chamber and a computer. The RSE test chamber includes a turntable disposed therein and a DUT is disposed on the turntable. The RSE test chamber further includes a receiving antenna configured to receive a RSE test signal from the DUT. The RSE test chamber further includes a movable stirrer configured to simulate the measurement environment of semi/fully anechoic chamber. The computer is connected to an I/O control box configured to control the movable stirrer and the turntable. The computer is further connected to a filter switch box configured to transmit the RSE test signal to a spectrum analyzer to obtain a measured value. The computer includes a test module with all necessary parameters for the RSE test and the test module is configured to generate an integrated test result.

6 Claims, 3 Drawing Sheets

finishes the high-speed RSE automated test
HIGH-SPEED RADIATED SPURIOUS EMISSION AUTOMATED TEST SYSTEM AND METHOD THEREOF

BACKGROUND OF THE INVENTION

1. Field of the Invention

The present invention relates to the radiated spurious emission (RSE) test field, in particular to a test system integrated with an automated test software to effectively reduce the time for investigation and measurement of RSE between 1~40 GHz in order to obtain the RSE measurement results of simulating semi/fully anechoic chambers and significantly reducing investigation and measurement time.

2. Description of the Prior Art

With advance of technology, various new wireless communication products are developed, which adopt more technologies about bandwidth/modulation/aggregated wave . . . ; for the reason, many test modes should be investigated and performed.

Radiated spurious emission (RSE) test is an important item in the certification of wireless communication products. The currently available RSE test mainly includes: direct far field (DFF) test; indirect far field (IFF) test and radiative near field test. However, both of DFF test and radiative near field test have the shortcomings of long test time, large test space, high cost, being limited to sampling test, etc. On the other hand, IFF test also has some shortcomings; for example, IFF test requires multiple point tests, needs long time for a single test and is not applicable to batching test in production lines.

Regarding the test space, the test is usually executed in a fully anechoic chamber or a semi anechoic chamber. The fully anechoic chamber can reduce the interference, caused by external electromagnetic waves, to test signals, and will not be influenced by weather; thus, the fully anechoic chamber can be considered to be close to a free space. The shortcoming of the fully anechoic chamber is of high cost, so the test space is limited. The structure of the semi anechoic chamber is similar to that of the fully anechoic chamber, which is also a hexahedral container with masks and the electromagnetic wave absorbing material is spread over the inner surface of the chamber. The difference between the semi anechoic chamber and the fully anechoic chamber is that the semi anechoic chamber uses a conductive floor, which will generate electromagnetic wave reflecting paths. Therefore, the signals received by the receiving antenna is the sum of the signals from the direct transmission paths and the reflecting paths, so the semi anechoic chamber can be considered to be close to an ideal open area.

As the international standards require that the RSE test for most wireless communication products should reach 40 GHz. Thus, if the RSE test is implemented via a semi/fully anechoic chamber, the time needed by the RSE test will be long, which may be up to several weeks.

Obviously, the currently available technologies still have some shortcomings in the implementation of the RSE test, so cannot satisfy the test requirements of wireless communication products in high-speed development. Accordingly, it has become an important issue for the industry to improve currently available technologies.

Therefore, in order to solve the above problems of the currently available technologies, the inventor of the application has kept trying hard to improve the currently available technologies by repeated calculations and experiments, and then finally finishes the high-speed RSE automated test system of the invention. The system can stably keep the output of the rated energy and achieve normal operation.

SUMMARY OF THE INVENTION

The objective of the present invention is to provide a high-speed radiated spurious emission (RSE) automated test system, which integrates a test system with an automated test software in order to effectively reduce the time for investigation and measurement of RSE between 1~40 GHz in order to obtain the RSE measurement results of simulating semi/fully anechoic chambers and significantly reducing investigation and measurement time.

To achieve the foregoing objective, the present invention provides a high-speed RSE automated test system, which includes a RSE test chamber, a computer and the test elements thereof.

The RSE test chamber includes a turntable (TT), a receiving antenna (RXA) and two movable stirrers (MS) disposed therein. A device under test (DUT) is disposed on the turntable, and the turntable is configured to rotate according to the operation mode selected based on a measurement requirement to adjust the direction of the DUT. One sides of the receiving antenna faces the turntable in order to receive the RSE test signal from the DUT. The movable stirrers are disposed on the surface, facing the other side of the receiving antenna, and the surface, above the receiving antenna, of the RSE test chamber respectively. The movable stirrers are used to stir the signal of the DUT by changing the position thereof so as to simulate the measurement environment of semi/fully anechoic chamber.

The computer is connected to an I/O control box, a filter switch box and a spectrum analyzer. The I/O control box is used to control the movable stirrers and the turntable inside the RSE test chamber. The filter switch box is connected to the receiving antenna and the spectrum analyzer so as to transmit the RSE test signal, of the DUT, received by the receiving antenna to the spectrum analyzer via the filter switch box and obtain a measured value (dBm/MHz).

The computer further includes a test module disposed therein. The test module is a computer software and the necessary parameters for RSE test are built in the test module. The test module is set by the computer to control the I/O control box, the filter switch box and the spectrum analyzer so as to obtain an integrated test result.

Via the above structure, the test method of the high-speed RSE automated test system includes the followings steps:

Disposing a DUT on a turntable of a RSE test chamber and setting an operation mode based on the measurement requirement according to the wireless technology specification of the DUT via a test module in a computer by a tester;

Setting measurement system parameters within the setting range provided by the test module according to measurement items/frequency band/country . . . needed by the DUT in order to finish the settings of the operation mode and the measurement system parameters;

Selecting proper paths or proper RF filters via controlling a filter switch box by the test module, and controlling a movable stirrer, inside the RSE test chamber, to change the position of the movable stirrer by an I/O control box, and controlling the turntable to rotate to change a direction of the turntable, and implementing an operational procedure set by the test module, and receiving a RSE test signal generated by the DUT via a receiving antenna, and transmitting the RSE test signal to a spectrum analyzer by the receiving antenna in order to obtain a measured value (dBm/MHz);

Reading the measured value, and executing the calculation and the compensation for the measured value, and exporting a test result of simulating semi/fully anechoic chamber by the test module;

Outputting and displaying the test result by the test module;

Determining whether the test result conforms to the specification requirement of the DUT according to the test result displayed by the tester, and returning to the initial step to re-execute setting and testing when the test result fails to conform to the specification requirement of the DUT, or proceeding to the next step when the test result conforms to the specification requirement of the DUT; and Saving test data in a designated path by the test module, and analyzing the test data saved and performing a difference comparison to generate and display a report to finish the high-speed RSE automated test process.

Preferably, when the test module executes the high-speed RSE automated test process in the previous steps, the test module performs a full-range RSE signal scanning for the targeted frequency range to conform the frequency points of the DUT generating the RSE signal, and then measures the peak value and the effective value of each of the frequency points.

Preferably, the compensation, for the measured value, executed by the test module comprises a site correction factor and a modulation correction factor.

Compared with prior art, the present invention can provide the advantages shown in the following table:

| Item | Present invention | Other technologies |
|---|---|---|
| Space size | High-speed test chamber 1.95 m × 1.275 m × 1.8 m (1st generation) 2.55 m × 1.275 m × 1.8 m (2nd generation) The space needed by the chamber is smaller, so the chamber can be easily established. | Semi anechoic chamber 9 m × 6 m × 5.7 m Fully anechoic chamber 12 m × 7 m × 6 m |
| Measurement time | 1~40 GHz RSE evaluation test + final measurement/1 mode High-speed test system: 5~10 minutes | 1~40 GHz RSE evaluation test + final measurement/1 mode Semi anechoic chamber: 100~120 minutes Fully anechoic chamber: 30 minutes |
| Noise level | Necessary length of RF cable High-speed test system: 2.5 m The nose level can be significantly decreased, which is in favor of measurement and analysis. | Necessary length of RF cable Semi anechoic chamber: 11~12 m Fully anechoic chamber: 7~8 m The noise level of the test system is high. |

BRIEF DESCRIPTION OF THE DRAWINGS

For a better understanding of the aforementioned embodiments of the invention as well as additional embodiments thereof, reference should be made to the Description of Embodiments below, in conjunction with the following drawings in which like reference numerals refer to corresponding parts throughout the figures.

DETAILED DESCRIPTION OF THE PREFERRED EMBODIMENT

The following description is about embodiments of the present invention; however it is not intended to limit the scope of the present invention.

Figure 1:
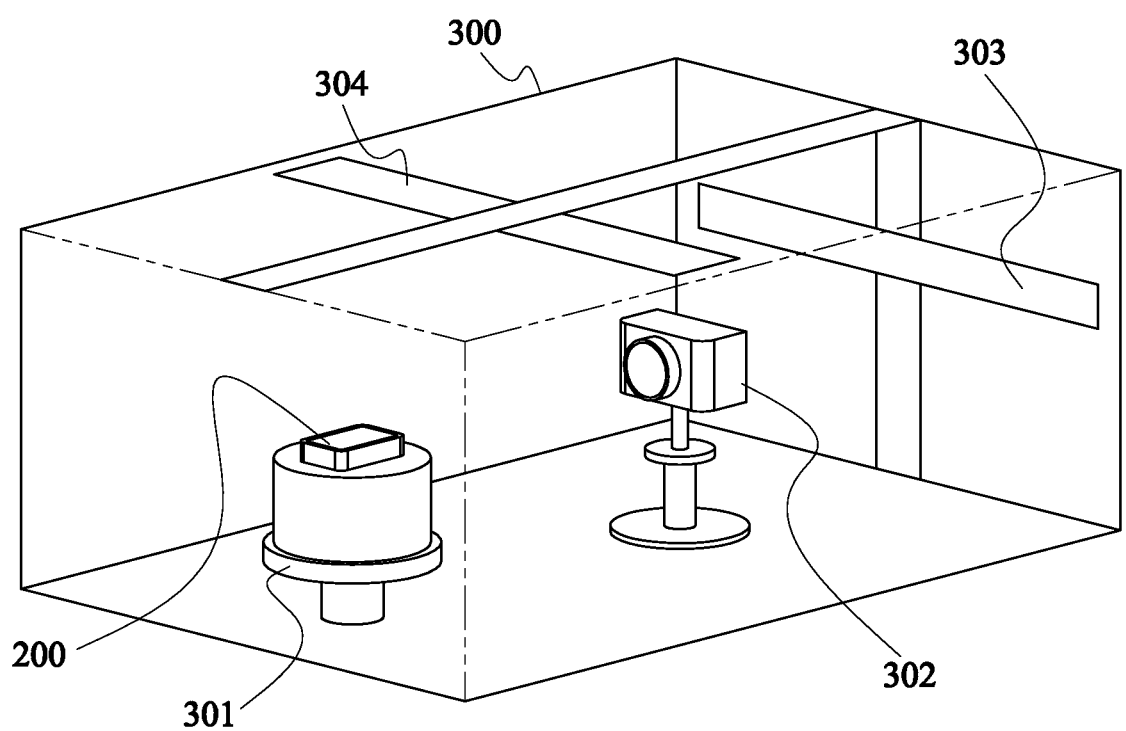
FIG. 1 is a perspective view of a high-speed RSE automated test system in accordance with the present invention.
Figure 2:
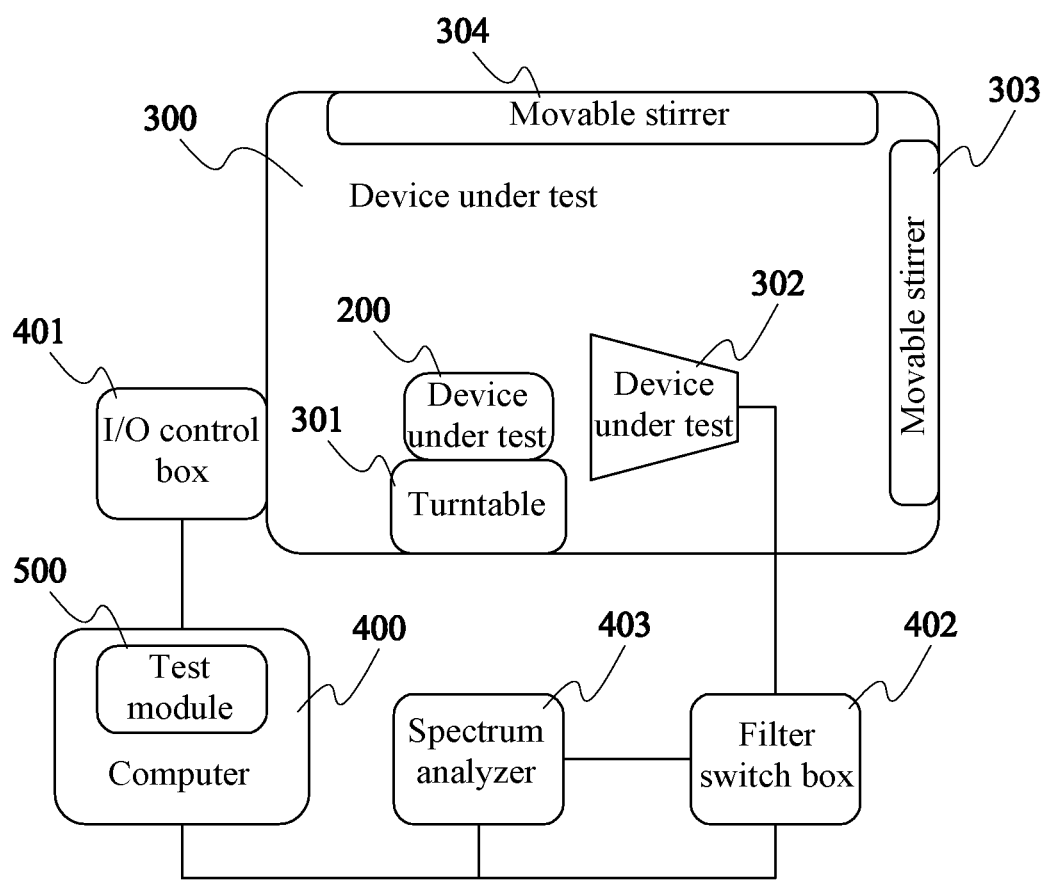
FIG. 2 is a structural block diagram of the high-speed RSE automated test system in accordance with the present invention.

Please refer to FIG. 1 and FIG. 2, which are a perspective view and a structural block diagram of a high-speed radiated spurious emission (RSE) automated test system in accordance with the present invention. The high-speed RSE automated test system mainly includes a device under test (DUT) 200, a RSE test chamber (RTC) 300, a computer 400 for controlling and analysis and some relevant test elements thereof. The RSE test chamber 300 includes a turntable (TT) 301, a receiving antenna (RXA) 302 and two movable stirrers (MS) 303, 304 disposed therein. The DUT 200 is disposed on the turntable 301 and can rotate according to the operation mode selected based on the measurement requirement to adjust the direction of the DUT 200. One side of the receiving antenna 302 faces the turntable 301 in order to receive the RSE test signal from the DUT 200. The movable stirrers 303, 304 are disposed on the surface, facing the other side of the receiving antenna 302, and the surface, above the receiving antenna 302, of the RSE test chamber 300 respectively. The movable stirrers 303, 304 can stir the signal of the DUT 200 by changing the positions thereof so as to simulate the measurement environment of semi/fully anechoic chamber.

The computer 400 is connected to an I/O control box (IOCB) 401, a filter switch box (FSB) 402 and a spectrum analyzer (SA) 403. The I/O control box 401 can control the movable stirrers 303, 304 and the turntable 301 inside the RSE test chamber 300. The filter switch box 402 is connected to the receiving antenna 302 and the spectrum analyzer 403 so as to transmit the RSE test signal, of the DUT 200, received by the receiving antenna 302 to the spectrum analyzer 403 via the filter switch box 403 and then obtain a measured value (dBm/MHz).

The computer 400 further includes a test module 500 disposed therein. The test module 500 is a computer software and the parameters for RSE test are built in the test module 500. The test module 500 is set by the computer 400 to control the I/O control box 401, the filter switch box 402 and the spectrum analyzer 403 so as to obtain an integrated test result.

Figure 3:
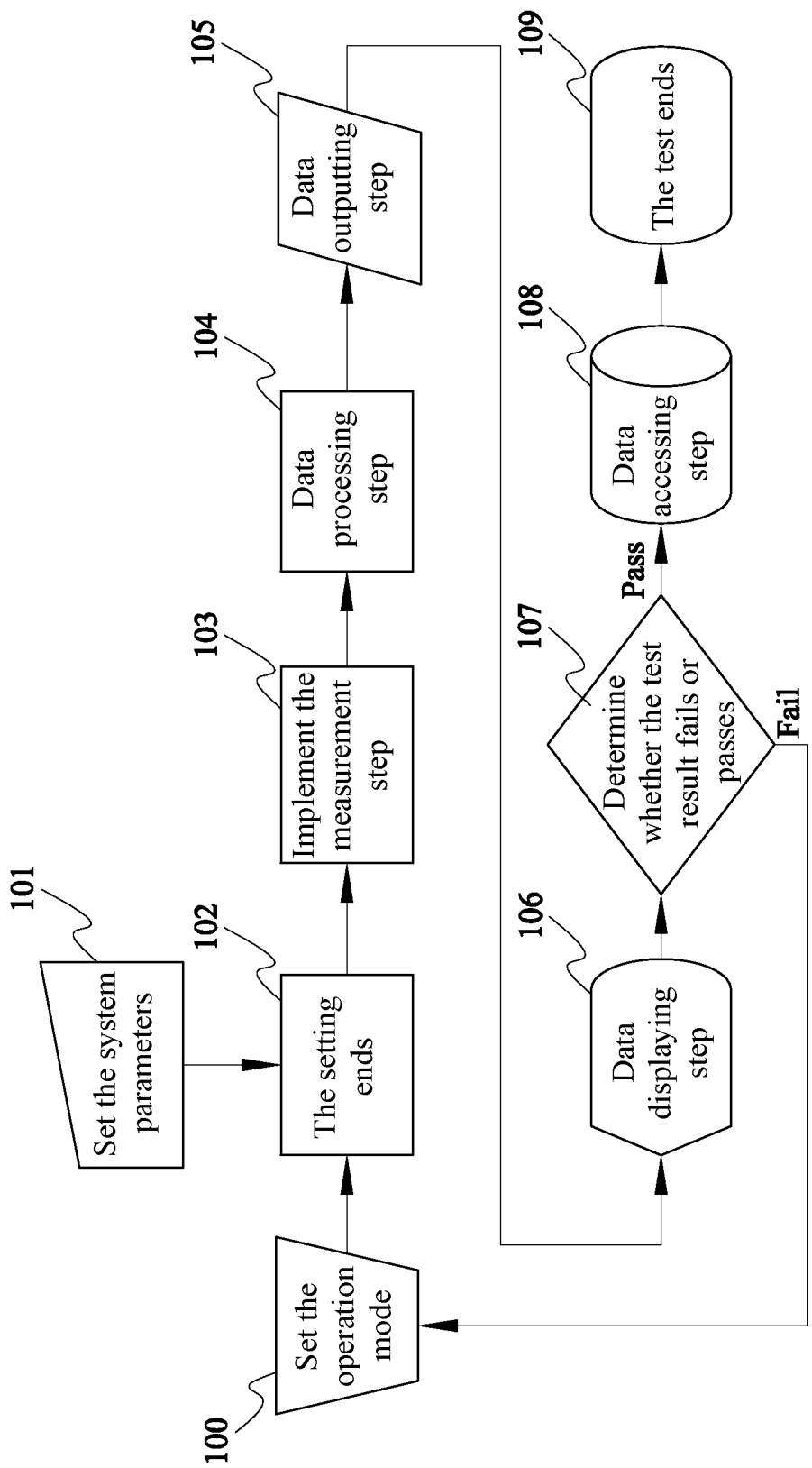
FIG. 3 is a flow chart of a test method based on the high-speed RSE automated test system in accordance with the present invention.

Please refer to FIG. 3, which is a flow chart of a test method based on the high-speed RSE automated test system in accordance with the present invention; the test method includes the following steps:

100: disposing the DUT 200 on the turntable 301 inside the RSE test chamber 300 and setting the operation mode based on the measurement requirement according to the wireless technology specification of the DUT 200 via the test module 500 in the computer 400 by the tester.

101: setting the measurement system parameters within the setting range provided by the test module 500 according to the measurement items/frequency band/country . . . needed by the DUT 200.

102: finishing the settings of the operation mode and the measurement system parameters by the test module 500.

103: selecting proper paths or proper RF filters via controlling the filter switch box 402 according to the information inputted in the step 102 by the test module 500, and controlling the movable stirrers 303, 304, inside the RSE test chamber 300, to change the positions of the movable stirrers 303, 304 by the I/O control box 401 controlled by the computer 400, and controlling the turntable 301 to rotate to change the direction of the turntable 301, and implementing the operational procedure set by the test module 500, and receiving the RSE test signal generated by the DUT 200 via the receiving antenna 302, and transmitting the RSE test signal to the spectrum analyzer 403 by the receiving antenna 302 in order to obtain a measured value (dBm/MHz). In the step, the test module 500 performs the full-range RSE signal scanning to scan the targeted frequency range in order to conform the frequency points of the DUT 200 generating the RSE signal, and then measures the peak value and the effective value of each of the frequency points.

104: reading the measured value of the step 103, and executing the calculation and the compensation for the test result of the site correction factor (SCF) and the modulation correction factor (MCF), and exporting the test result of simulating semi/fully anechoic chamber by the test module 500.

105: outputting and displaying the test result by the test module 500.

106: displaying the test result of the step 104 according to the outputted data of the step 104 by the test module 500.

107: determining whether the test result conforms to the specification requirement of the DUT 200 according to the displayed test result by the tester, and returning to the initial step 100 to re-execute the setting and testing when the test result shows "Fail", or proceeding to the next step when the test result shows "Pass".

108: saving test data in the designated path by the test module 500, and analyzing the saved test data and performing the difference comparison to generate and display a report.

109: finishing the high-speed RSE automated test process.

The high-speed RSE automated test system according to the present invention can simulate the measurement environment of semi/fully anechoic chamber by switching between multiple modes via the movable stirrers 303, 304 and the settings of the test software. The system is further integrated with the currently available high-speed FFT spectrum analyzer 403, so the test performance of the system can be increased by more than 10 times. Compared with the semi anechoic chamber, the measurement time of the system can be reduced by 90%. Therefore, the system can benefit the development of wireless communication products and solve the problems of these products.

The above disclosure is related to the detailed technical contents and inventive features thereof. Those skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A high-speed radiated spurious emission (RSE) automated test method, comprising following steps:
    disposing a device under test (DUT) on a turntable of a RSE test chamber and setting an operation mode based on a measurement requirement according to a wireless technology specification of the DUT via a test module in a computer by a tester so as to start a high-speed RSE automated test process;
    setting measurement system parameters within a setting range provided by the test module according to measurement items/frequency band/country needed by the DUT in order to finish settings of the operation mode and the measurement system parameters;
    selecting paths or RF filters via controlling a filter switch box by the test module, and controlling a movable stirrer, inside the RSE test chamber, to change a position of the movable stirrer by an I/O control box, and controlling the turntable to rotate to change a direction of the turntable, and implementing an operational procedure set by the test module, and receiving a RSE test signal generated by the DUT via a receiving antenna, and transmitting the RSE test signal to a spectrum analyzer by the receiving antenna in order to obtain a measured value (dBm/MHz);
    reading the measured value, and executing a calculation and a compensation for the measured value, and exporting a test result of simulating semi/fully anechoic chamber by the test module;
    outputting and displaying the test result by the test module;
    determining whether the test result conforms to a specification requirement of the DUT according to the test result displayed by the tester, and returning to an initial step to re-execute setting and testing when the test result fails to conform to the specification requirement of the DUT, or proceeding to a next step when the test result conforms to the specification requirement of the DUT; and
    saving test data in a designated path by the test module, and analyzing the test data saved and performing a difference comparison to generate and display a report to finish the high-speed RSE automated test process.

2. The high-speed RSE automated test method of claim 1, wherein when the test module executes the high-speed RSE automated test process, the test module performs a full-range RSE signal scanning for a targeted frequency range to conform frequency points of the DUT generating the RSE signal, and then measures a peak value and an effective value of each of the frequency points.

3. The high-speed RSE automated test method of claim 1, wherein the compensation, for the measured value, executed by the test module comprises a site correction factor and a modulation correction factor.

4. A high-speed radiated spurious emission (RSE) automated test system, comprising:
    a RSE test chamber, comprising a turntable disposed therein, wherein a device under test (DUT) is disposed on the turntable, and the turntable is configured to rotate according to an operation mode selected based on a measurement requirement to adjust a direction of the DUT, wherein a receiving antenna is disposed inside the RSE test chamber and one side of the receiving antenna faces the turntable in order to receive a RSE test signal from the DUT, wherein a movable stirrer is disposed on a surface, facing the other side of the receiving antenna, of the RSE test chamber, and the movable stirrer is configured to stir the RSE test signal of the DUT by changing a position thereof so as to simulate a measurement environment of semi/fully anechoic chamber;
    a computer, connected to an I/O control box and configured to control the I/O control box, wherein the I/O control box is configured to control the movable stirrer and the turntable inside the RSE test chamber, wherein the computer is further connected to a filter switch box and a spectrum analyzer, and the filter switch box is connected to the receiving antenna and the spectrum analyzer so as to transmit the RSE test signal, of the DUT, received by the receiving antenna to the spectrum analyzer via the filter switch box and obtain a measured value; and a test module, disposed inside the computer, wherein parameters for RSE test are built in the test module, and the test module is set by the computer to control the I/O control box, the filter switch box and the spectrum analyzer so as to obtain an integrated test result.

5. The high-speed RSE automated test system of claim 4, comprising two the movable stirrers, wherein the movable stirrers are movable, and disposed on the surface, facing the other side of the receiving antenna, of the RSE test chamber and a surface, above the receiving antenna, of the RSE test chamber respectively.

6. The high-speed RSE automated test system of claim 4, wherein the test module is a computer software stored in a hard drive of the computer.

\* \* \* \* \*